(12) United States Patent
Wischnesky

(10) Patent No.: US 10,569,615 B2
(45) Date of Patent: Feb. 25, 2020

(54) COMPUTER COOLING ASSEMBLY

(71) Applicant: Johann Wischnesky, Costa Mesa, CA (US)

(72) Inventor: Johann Wischnesky, Costa Mesa, CA (US)

(*) Notice: Subject to any disclaimer, the term of this patent is extended or adjusted under 35 U.S.C. 154(b) by 0 days.

(21) Appl. No.: 16/166,519

(22) Filed: Oct. 22, 2018

(65) Prior Publication Data
US 2019/0054794 A1 Feb. 21, 2019

Related U.S. Application Data

(63) Continuation-in-part of application No. 15/480,549, filed on Apr. 6, 2017, now Pat. No. 10,108,233.

(51) Int. Cl.
| | | |
|---|---|---|
| *H05K 7/20* | (2006.01) | |
| *F25B 27/00* | (2006.01) | |
| *F25B 29/00* | (2006.01) | |
| *B60H 1/00* | (2006.01) | |

(52) U.S. Cl.
CPC ..... *B60H 1/00271* (2013.01); *H05K 7/20236* (2013.01); *H05K 7/20336* (2013.01); *H05K 7/20418* (2013.01); *H05K 7/20854* (2013.01); *H05K 7/20872* (2013.01); *B60H 2001/00307* (2013.01)

(58) Field of Classification Search
CPC .. H05K 7/20; H05K 7/20281; H05K 7/20263; H05K 7/20272; F25B 27/00; F25B 29/00
USPC ...... 361/679.49, 679.48, 697, 699; 165/11.1, 165/61, 80.2, 80.3, 104.26, 104.28, 165/104.31, 104.33, 104.34; 62/6, 467
See application file for complete search history.

(56) References Cited

U.S. PATENT DOCUMENTS

| | | | |
|---|---|---|---|
| 4,644,443 A | 2/1987 | Swensen et al. | |
| 5,794,450 A * | 8/1998 | Alexander | F25B 9/145 |
| | | | 62/467 |
| D407,714 S | 4/1999 | Yeh | |
| 6,234,240 B1 | 5/2001 | Cheon | |
| 6,894,899 B2 | 5/2005 | Wu | |
| 7,403,392 B2 | 7/2008 | Tipley | |
| 8,789,384 B2 | 7/2014 | Eckberg | |
| 2004/0125558 A1 * | 7/2004 | DiStefano | G06F 1/203 |
| | | | 361/679.48 |
| 2005/0099775 A1 | 5/2005 | Pokhama | |
| 2008/0302505 A1 * | 12/2008 | Kato | F25B 23/006 |
| | | | 165/61 |
| 2009/0301125 A1 * | 12/2009 | Myles | B60H 1/00271 |
| | | | 62/323.1 |
| 2010/0103618 A1 | 4/2010 | Campbell | |
| 2010/0108291 A1 * | 5/2010 | Onnerud | G06F 1/203 |
| | | | 165/80.2 |
| 2012/0020023 A1 | 1/2012 | Nemesh | |

(Continued)

*Primary Examiner* — Xiaoliang Chen

(57) ABSTRACT

A computer cooling assembly for a computer of a vehicle, such as an autonomous driving vehicle, includes a shell that defines an interior space. The shell is configured to house the computer. A cooling loop is positioned in the interior space proximate to the computer. The cooling loop is configured to couple to an air conditioning system. A heat transfer medium is positioned in the interior space. The heat transfer medium is in contact with the cooling loop and the computer. The heat transfer medium is configured to transfer heat that is generated by the computer to the cooling loop.

10 Claims, 5 Drawing Sheets

(56) References Cited

U.S. PATENT DOCUMENTS

2016/0183409 A1* 6/2016 Zhou .................. H05K 7/20281
                                                                361/699
2017/0020003 A1   1/2017 Dragone

* cited by examiner

COMPUTER COOLING ASSEMBLY

CROSS-REFERENCE TO RELATED APPLICATIONS

This application is a continuation in part of application Ser. No. 15/480,549 filed Apr. 6, 2017, and issued Oct. 23, 2018, as U.S. Pat. No. 10,108,233.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION (1) Field of the Invention
(2) Description of Related Art Including Information Disclosed Under 37 CFR 1.97 and 1.98

The disclosure and prior art relates to cooling assemblies and more particularly pertains to a new cooling assembly for a computer.

BRIEF SUMMARY OF THE INVENTION

An embodiment of the disclosure meets the needs presented above by generally comprising a shell that defines an interior space. The shell is configured to house a computer. A cooling loop is positioned in the interior space proximate to the computer. The cooling loop is configured to couple to an air conditioning system. A heat transfer medium is positioned in the interior space. The heat transfer medium is in contact with the cooling loop and the computer. The heat transfer medium is configured to transfer heat that is generated by the computer to the cooling loop.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

Figure 1:
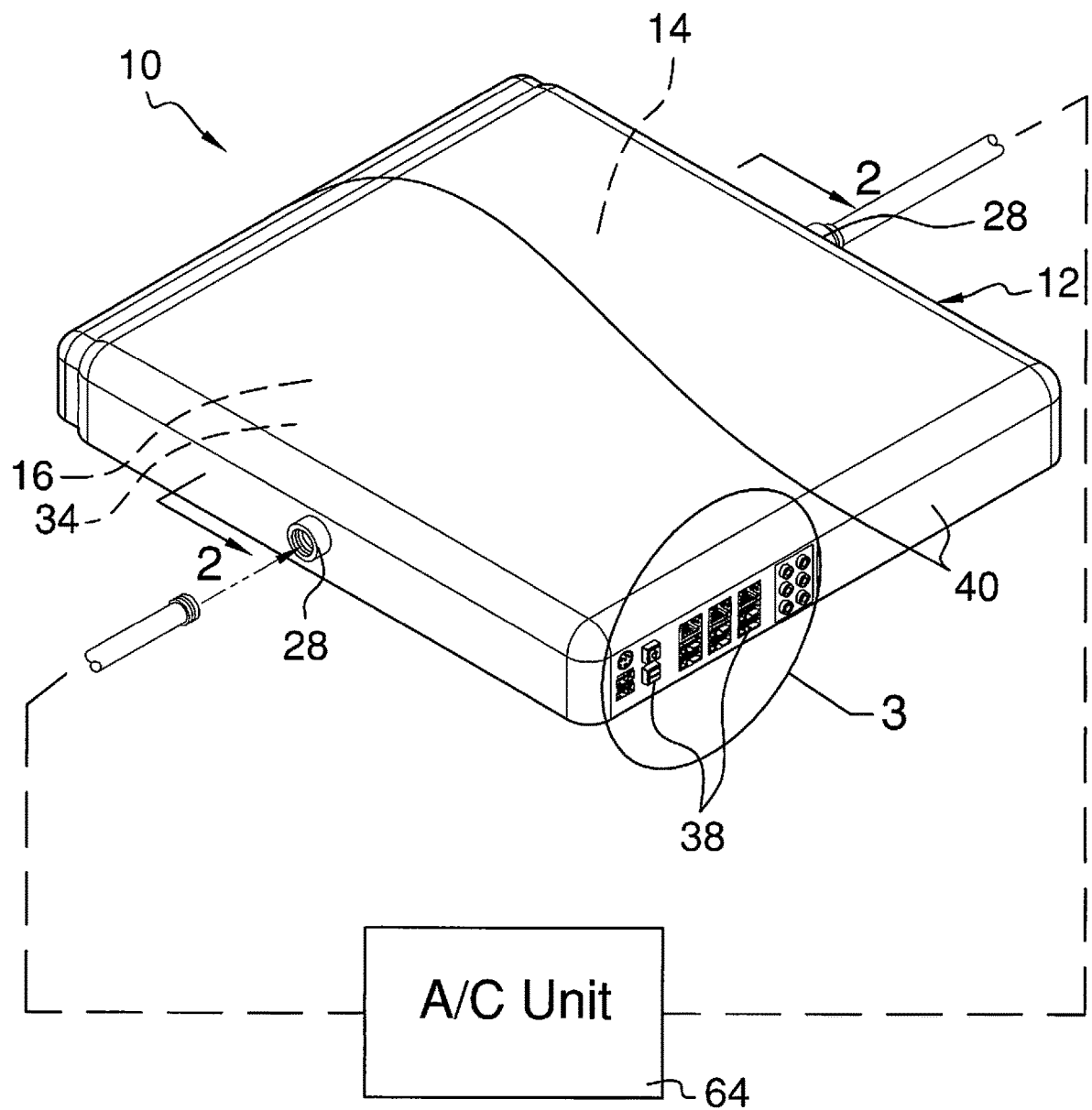
FIG. 1 is an isometric perspective view of a computer cooling assembly according to an embodiment of the disclosure.
Figure 2:
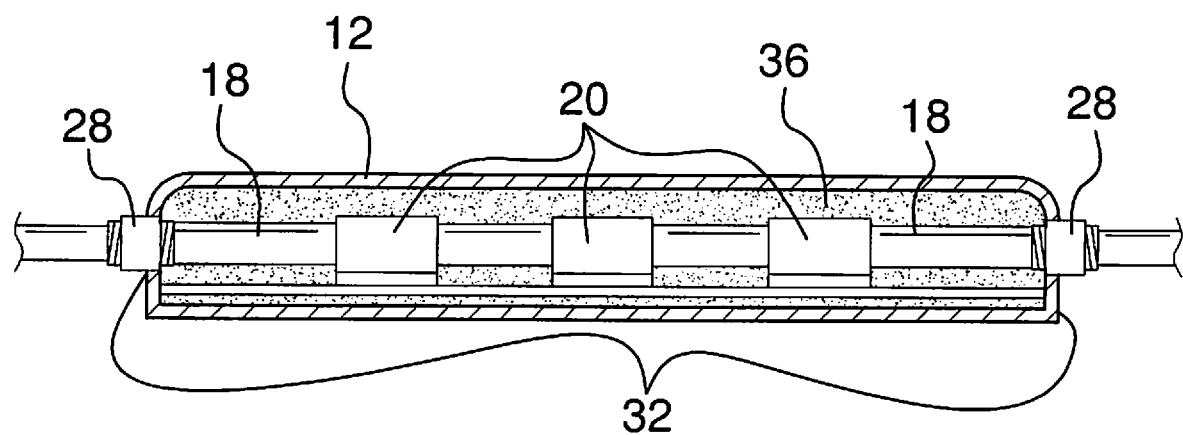
FIG. 2 is a cross-sectional view of an embodiment of the disclosure.
Figure 3:
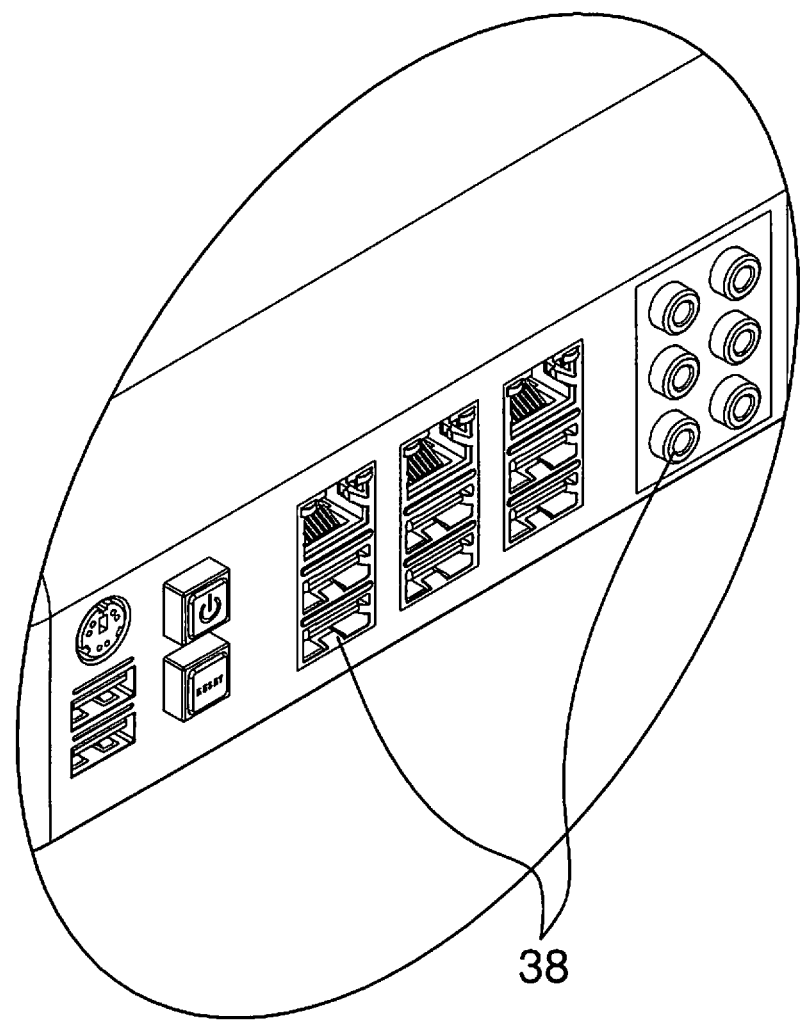
Figure 4:
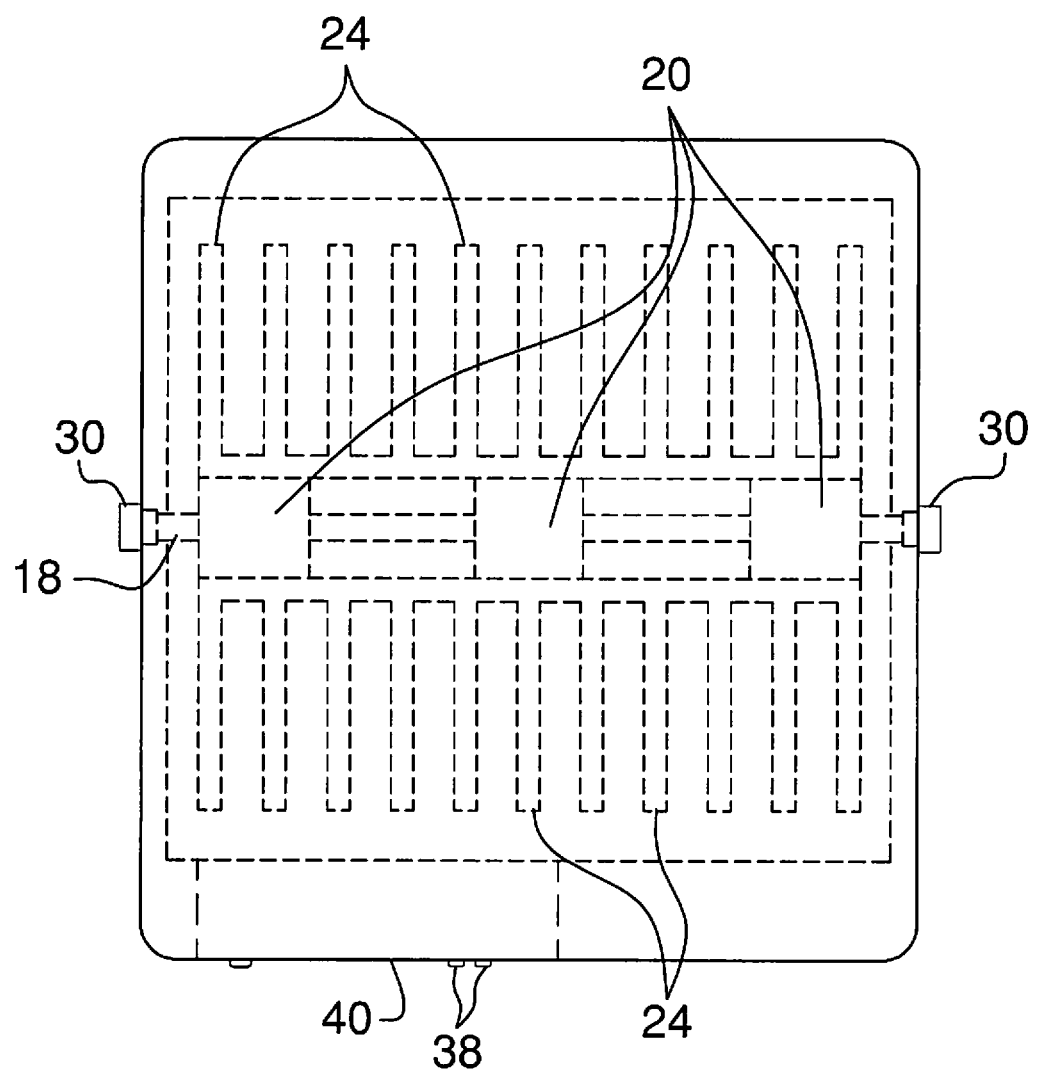
Figure 5:
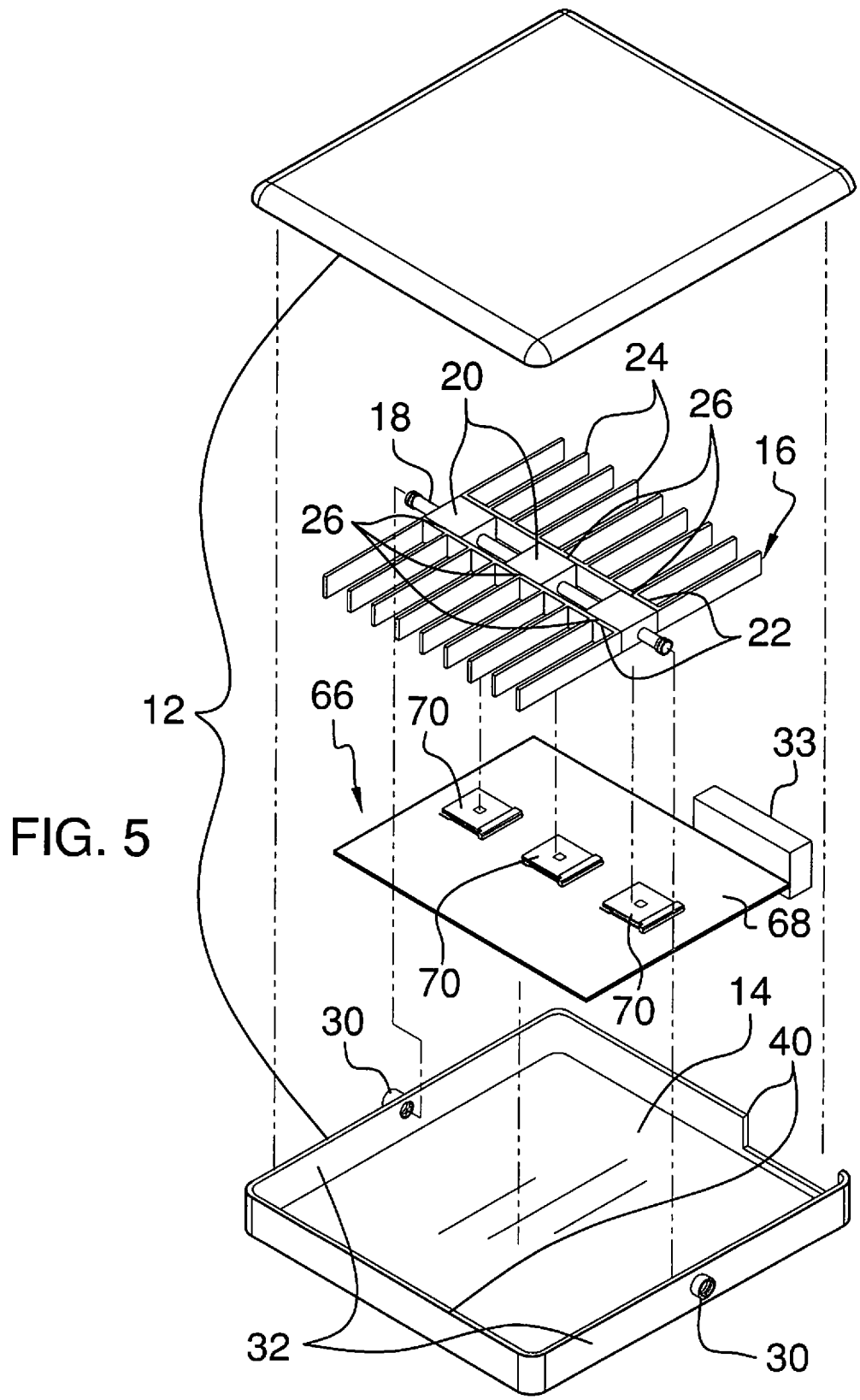

FIG. 3 is a detail view of an embodiment of the disclosure.
FIG. 4 is a top view of an embodiment of the disclosure.
FIG. 5 is an exploded view of an embodiment of the disclosure.

DETAILED DESCRIPTION OF THE INVENTION

With reference now to the drawings, and in particular to FIGS. 1 through 5 thereof, a new cooling assembly embodying the principles and concepts of an embodiment of the disclosure and generally designated by the reference numeral 10 will be described.

As best illustrated in FIGS. 1 through 5, the computer cooling assembly 10 generally comprises a shell 12 that defines an interior space 14. The shell 12 is configured to house a computer 66 that comprises a plurality of computer processing units 70 and a motherboard 68. In one embodiment, the shell 12 is substantially rectangularly box shaped.

A cooling loop 16 is positioned in the interior space 14 proximate to the computer. The cooling loop 16 is configured to couple to an air conditioning system 64. The air conditioning system 64 may be in a vehicle, a stand alone air conditioning unit, a refrigeration device, or the like. In one embodiment, the cooling loop 16 comprises a tube 18. In another embodiment, the cooling loop 16 comprises a plurality of blocks 20 that is numerically equivalent to the plurality of computer processing units 70. Each block 20 is coupled to the tube 18 so that the block 20 is positioned adjacent to a respective computer processing unit 70. In yet another embodiment, the blocks 20 are substantially rectangularly box shaped. In still yet another embodiment, the blocks 20 are hollow and fluidically coupled to the tube 18 so that the blocks 20 are fluidically coupled to the air conditioning system 64.

In one embodiment, the cooling loop 16 comprises a pair of plates 22 and a plurality of fins 24. Each plate 22 is coupled to and extends along a respective opposing edge 26 of the plurality of blocks 20. The plurality of fins 24 is coupled to and extends from the plates 22. The fins 24 are positioned proximate to the mother board 68. In another embodiment, the plates 22 are hollow and fluidically coupled to the blocks 20. In this embodiment, the fins 24 are hollow and fluidically coupled to the plates 22. As such, the fins 24 are fluidically coupled to the air conditioning system 64.

A pair of connectors 28 is positioned through and coupled to the shell 12. The connectors 28 are fluidically coupled to the cooling loop 16. The connectors 28 are configured to couple to the air conditioning system 64. A respective connector 28 is configured to permit coolant to flow into the cooling loop 16. An associated connector 28 is configured to allow the coolant to exit the cooling loop 16. In one embodiment, each connector 28 comprises a pipe 30 that is coupled to and extends from the shell 12. The pipes 30 are internally threaded. In another embodiment, the pipes 30 are positioned singly on opposing sides 32 of the shell 12.

A heat transfer medium 34 is positioned in the interior space 14. The heat transfer medium 34 is in contact with the cooling loop 16 and the computer. The heat transfer medium 34 is configured to transfer heat that is generated by the computer 66 to the cooling loop 16. In one embodiment, the heat transfer medium 34 comprises mineral oil. In another embodiment, the heat transfer medium 34 comprises a nan diamond gel 36.

A plurality of ports 38 is coupled to the shell 12. The ports 38 are operationally coupled to the computer 66. The ports 38 are configured to allow connection of the computer 66 to devices that are external to the shell 12. In one embodiment, the ports 38 are positioned on a respective opposing end 40 of the shell 12.

In use, the pipes 30 that are positioned on the shell 12 are configured to couple the tube 18 to the air conditioning system 64. The pipes 30 are configured to permit the coolant to flow into and exit from the cooling loop 16. The heat transfer medium 34 that is positioned in the interior space 14 is configured to transfer the heat that is generated by the computer processing units 70 to the blocks 20 and to transfer the heat that is generated by the motherboard 68 to the fins 24.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A computer cooling assembly comprising:
   a shell defining an interior space, said shell housing a computer comprising a plurality of computer processing units and a motherboard;
   a cooling loop positioned in said interior space proximate to the computer, said cooling loop being configured for coupling to an air conditioning system, said cooling loop comprising a tube;
   a heat transfer medium positioned in said interior space, said heat transfer medium being in contact with said cooling loop and the computer; and
   wherein said heat transfer medium is positioned in said interior space such that said heat transfer medium is configured for transferring heat generated by the computer to said cooling loop;
   a plurality of blocks numerically equivalent to the plurality of computer processing units, each said block being coupled to said tube such that said block is positioned adjacent to its respective computer processing unit, said blocks being substantially rectangularly box shaped, said blocks being hollow and fluidically coupled to said tube such that said blocks are fluidically coupled to the air conditioning system;
   a pair of plates, each said plate being coupled to and extending along a respective opposing edge of said plurality of blocks, said plates being hollow and fluidically coupled to said blocks such that said plates are fluidically coupled to the air conditioning system; and
   a plurality of fins coupled to and extending from said plates such that said fins are positioned proximate to the mother board, said fins being hollow and fluidically coupled to said plates such that said fins are fluidically coupled to the air conditioning system.

2. The assembly of claim 1, further including said shell being substantially rectangularly box shaped.

3. The assembly of claim 1, further including a pair of connectors positioned through and coupled to said shell, said connectors being fluidically coupled to said cooling loop, said connectors being configured for coupling to the air conditioning system, wherein said connectors are positioned on said shell such that a respective said connector is configured for permitting coolant to flow into said cooling loop and an associated said connector is configured for allowing the coolant to exit said cooling loop.

4. The assembly of claim 3, further including each said connector comprising a pipe coupled to and extending from said shell, said pipes being internally threaded.

5. The assembly of claim 4, further including said pipes being positioned singly on opposing sides of said shell.

6. The assembly of claim 1, further including said heat transfer medium comprising mineral oil.

7. The assembly of claim 1, further including said heat transfer medium comprising a nanodiamond gel.

8. The assembly of claim 1, further including a plurality of ports coupled to said shell, said ports being operationally coupled to the computer, wherein said ports are positioned on said shell such that said ports are configured for connecting the computer to devices external to said shell.

9. The assembly of claim 8, further including said ports being positioned on a respective opposing end of said shell.

10. A computer cooling assembly comprising:
    a shell defining an interior space, said shell housing a computer comprising a plurality of computer processing units and a motherboard, said shell being substantially rectangularly box shaped;
    a cooling loop positioned in said interior space proximate to the computer, said cooling loop being configured for coupling to an air conditioning system, said cooling loop comprising:
    a tube,
    a plurality of blocks numerically equivalent to the plurality of computer processing units, each said block being coupled to said tube such that said block is positioned adjacent to its respective computer processing unit, said blocks being substantially rectangularly box shaped,
    a pair of plates, each said plate being coupled to and extending along a respective opposing edge of said plurality of blocks, and
    a plurality of fins coupled to and extending from said plates such that said fins are positioned proximate to the mother board;
    a pair of connectors positioned through and coupled to said shell, said connectors being fluidically coupled to said cooling loop, said connectors being configured for coupling to the air conditioning system, wherein said connectors are positioned on said shell such that a respective said connector is configured for permitting coolant to flow into said cooling loop and an associated said connector is configured for allowing the coolant to exit said cooling loop, each said connector comprising a pipe coupled to and extending from said shell, said pipes being internally threaded, said pipes being positioned singly on opposing sides of said shell;

a heat transfer medium positioned in said interior space, said heat transfer medium being in contact with said cooling loop and the computer, wherein said heat transfer medium is positioned in said interior space such that said heat transfer medium is configured for transferring heat generated by the computer to said cooling loop, said heat transfer medium comprising mineral oil, said heat transfer medium comprising a nanodiamond gel;

a plurality of ports coupled to said shell, said ports being operationally coupled to the computer, wherein said ports are positioned on said shell such that said ports are configured for connecting the computer to devices external to said shell, said ports being positioned on a respective opposing end of said shell;

wherein said connectors are positioned on said shell such that said respective said connector is configured for permitting the coolant to flow into said cooling loop and said associated said connector is configured for allowing the coolant to exit said cooling loop, wherein said heat transfer medium is positioned in said interior space such that said heat transfer medium is configured for transferring heat generated by the computer processing units to said blocks and transferring heat generated by the motherboard to said fins;

said blocks being hollow and fluidically coupled to said tube such that said blocks are fluidically coupled to the air conditioning system;

said plates being hollow and fluidically coupled to said blocks such that said plates are fluidically coupled to the air conditioning system; and said fins being hollow and fluidically coupled to said plates such that said fins are fluidically coupled to the air conditioning system.

* * * * *